United States Patent
Gearhardt

(12) 
(10) Patent No.: US 7,152,012 B2
(45) Date of Patent: Dec. 19, 2006

(54) FOUR POINT MEASUREMENT TECHNIQUE FOR PROGRAMMABLE IMPEDANCE DRIVERS RAPIDCHIP AND ASIC DEVICES

(75) Inventor: Kevin Gearhardt, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/952,213

(22) Filed: Sep. 28, 2004

(65) Prior Publication Data

US 2006/0074580 A1    Apr. 6, 2006

(51) Int. Cl.
    *G01R 31/00* (2006.01)
(52) U.S. Cl. .................. 702/120; 324/763; 714/734
(58) Field of Classification Search .............. 702/58, 702/64–65, 117, 120, 182–183, 185; 324/522–523, 324/525, 754, 763, 765; 714/30, 726, 734, 714/745
See application file for complete search history.

(56) References Cited

U.S. PATENT DOCUMENTS

| | | | | |
|---|---|---|---|---|
| 4,707,620 A | * | 11/1987 | Sullivan et al. | 326/86 |
| 4,970,454 A | * | 11/1990 | Stambaugh et al. | 324/73.1 |
| 5,642,364 A | * | 6/1997 | Farwell | 714/745 |
| 5,652,722 A | * | 7/1997 | Whitefield | 365/185.23 |

* cited by examiner

*Primary Examiner*—Marc S. Hoff
*Assistant Examiner*—Mary Catherine Baran
(74) *Attorney, Agent, or Firm*—Trexler, Bushnell, Giangiori, Blackstone & Marr, Ltd.

(57) ABSTRACT

A four point measurement technique for testing programmable impedance drivers such as the BZIO buffers contained in RapidChip® and ASIC devices. Specifically, two test pads are added for taking voltage measurements at additional points. By taking the additional voltage measurements and performing some calculation using Ohm's law, the error components of the testing process are effectively eliminated. The technique is suitable for use at wafer sort where additional device pads can be made available for contact with the automated test equipment (ATE) used in the manufacturing test environment.

7 Claims, 1 Drawing Sheet

---

Providing a circuit which includes a point for connecting to ATE, a point for connecting to ground, a device between the points, a test pad between the device and the point connected to the ATE, and a test pad between the device and the point connected to ground

↓

Determining the voltages at the test pads and mathematically calculating the resistance of the device

↓

Testing the calculated device resistance against previously defined test limits by the manufacturing test program being run on the ATE

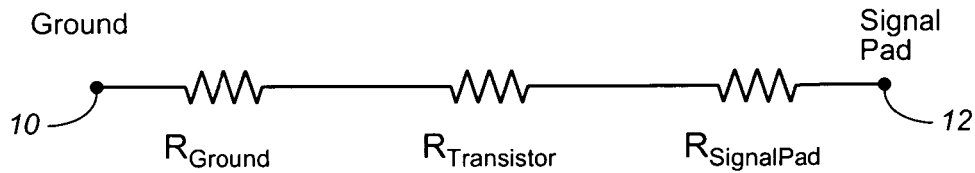

FIG. 1
*(PRIOR ART)*

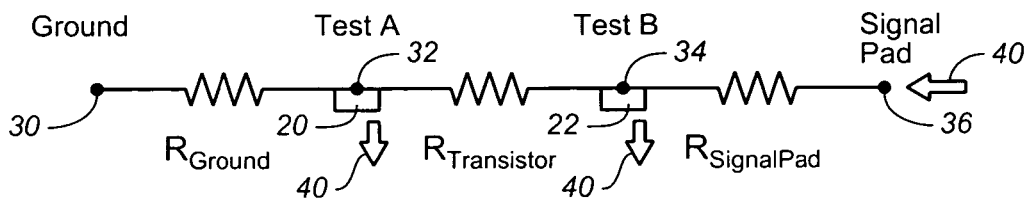

| Providing a circuit which includes a point for connecting to ATE, a point for connecting to ground, a device between the points, a test pad between the device and the point connected to the ATE, and a test pad between the device and the point connected to ground |

↓

| Determining the voltages at the test pads and mathematically calculating the resistance of the device |

↓

| Testing the calculated device resistance against previously defined test limits by the manufacturing test program being run on the ATE |

FIG. 3

FOUR POINT MEASUREMENT TECHNIQUE FOR PROGRAMMABLE IMPEDANCE DRIVERS RAPIDCHIP AND ASIC DEVICES

BACKGROUND

The present invention generally relates to the production test requirements for testing programmable impedance drivers such as the BZIO buffers contained in RapidChip® and ASIC devices, and more specifically relates to a four point measurement technique.

The problem faced in the manufacturing test environment is that it is a non-ideal situation with respect to the contact resistance that occurs at multiple points between the tester's pin electronics and the actual device-under-test (DUT). These contact resistances are difficult to control at best, and cannot be completely eliminated. As such they contribute an error component to any resistance measurements that are to be made on the actual DUT. These errors in the measurements result in failing tests during the manufacturing test flow causing product yield issues.

FIG. 1 represents the typical circuit for an n-channel device which is to be measured on the DUT, including the error components which are an inherent part of the measurement process. A programmable impedance driver typically consists of several transistor 'legs' which can be selectively turned on to provide varying drive strengths. Regardless of the combination of those various transistor legs, the final effective drive strength can be viewed as a lump-sum resistance of the transistors in their 'ON' state. This is the value $R_{Transistor}$ shown in FIG. 1. The labels 'Ground' and 'Signal Pad' refer to the contact points (identified with reference numerals 10 and 12 in FIG. 1) between the automatic test equipment (ATE) pin electronics and the DUT, while '$R_{Ground}$' and '$R_{Signalpad}$' refer to the contact resistances associated with those connections. These contact resistances are what contribute to the error components of the test measurement, resulting in the inability to accurately test the $R_{Transistor}$ value. The standard approach to measuring the on-resistance of a transistor or transistor network on the ATE is to inject a current at 'Signal Pad' (i.e., at point 12 in FIG. 1) and measure the resultant voltage at the pad. The transistor on-resistance is then calculated using Ohm's law, or R=V/I. The problem is that the calculated on-resistance includes the unknown error components associated with '$R_{Ground}$' and '$R_{SignalPad}$'.

The only existing solutions to the aforementioned problems involve the relaxation of test limits for the DUT, or the elimination of the test altogether. While this can address the manufacturing test problem, it provides the risk of shipping product out which is out of specification. Alternatively, the testing can be performed within the specified test limits, and the manufacturer is forced to accept any associated yield losses during the manufacturing test process.

OBJECTS AND SUMMARY

An object of an embodiment of the present invention is to provide a measurement technique which allows the error components of the testing process to be effectively eliminated.

An object of an embodiment of the present invention is to provide a measurement technique which provides the ability to do accurate ATE measurements of a DUT's programmable impedance driver(s) which represent only actual on-resistance values of those drivers.

Briefly, and in accordance with at least one of the foregoing objects, an embodiment of the present invention provides a four point measurement technique for testing programmable impedance drivers such as the BZIO buffers contained in RapidChip® and ASIC devices. Specifically, two test pads are added for taking voltage measurements at additional points. By taking the additional voltage measurements and performing some calculation using Ohm's law, the error components of the testing process are effectively eliminated. The technique is suitable for use at wafer sort where additional device pads can be made available for contact with the automated test equipment (ATE) used in the manufacturing test environment.

BRIEF DESCRIPTION OF THE DRAWINGS

The organization and manner of the structure and operation of the invention, together with further objects and advantages thereof, may best be understood by reference to the following description, taken in connection with the accompanying drawings, wherein:

FIG. 1 illustrates a prior art measurement technique;

FIG. 2 illustrates a four point measurement technique which is in accordance with an embodiment of the present invention;

FIG. 3 illustrates a method which is in accordance with an embodiment of the present invention.

DESCRIPTION

While the invention may be susceptible to embodiment in different forms, there is shown in the drawings, and herein will be described in detail, a specific embodiment of the invention. The present disclosure is to be considered an example of the principles of the invention, and is not intended to limit the invention to that which is illustrated and described herein.

The present invention provides a measurement technique which allows the error components of the testing process to be effectively eliminated by performing a four-point measurement of the programmable impedance drivers contained within the design. The technique is suitable for use at wafer sort where additional device pads can be made available for contact with the automated test equipment (ATE) used in the manufacturing test environment. Using a four-point measurement technique requires the addition of two test pads per programmable driver (p- or n-channel) to be tested.

FIG. 2 represents a circuit for an n-channel device which is to be measured on the DUT, and reflects the addition of the two test pads 20 and 22 required to perform the four-point measurement technique in accordance with the present invention. Specifically, reference numerals 30, 32, 34 and 36 in FIG. 2 identify the four test points. Compared to FIG. 1, the labels 'Test A' and 'Test B' in FIG. 2 represent the added test points (and reference numerals 20 and 22 identify the two test pads) required to perform the four-point measurement. As previously stated in connection with the discussion regarding FIG. 1, the standard approach to measuring the on-resistance of a transistor or transistor network on the ATE is to inject a current at 'Signal Pad' (i.e., at point 12 in FIG. 1) and measure the resultant voltage. This is where the four-point measurement technique in accordance with the present invention differs. The known test current is still injected at 'Signal Pad' (i.e., at point 36 in FIG. 2), and then the ATE measures the voltage at both 'Test A' (point 32) and 'Test B' (point 34) (i.e., at pads 20 and 22, respectively) via a high-impedance connection (action by the ATE (application of the known test current and measurement of the voltages at points 32 and 34) is identified with arrows 40 in FIG. 2). Given those two voltages, the value of $R_{Transistor}$ can be calculated using Ohm's law, where $R_{Transistor}=((\text{Voltage @ Test B})-(\text{Voltage@Test A}))/\text{Injection Current}$. This calculated transistor on-resistance can then be tested against previously defined test limits by the manufacturing test program being run on the ATE. The inclusion of the measurement points 'Test A' (point 32) and 'Test B' (point 34) allows for a measurement which eliminates the errors previously discussed.

FIG. 3 illustrates a method which is in accordance with an embodiment of the present invention and is self-explanatory in light of the foregoing description.

The primary feature of the present invention is the ability to perform accurate ATE measurements of a DUT's programmable impedance driver(s) which represent only actual on-resistance values of those drivers. The inclusion of two test pads allows for an accurate measurement with no unknown components.

The primary advantage of the present invention is that the technique can be performed for any device which requires the testing of on-chip programmable impedance drivers. Due to the fact that additional device pads are required for the measurement, it is likely that such testing would only be done on a sample basis of the representative device drivers on the design, to keep the number of test pads at a minimum. Also, this test technique would most likely be used only in the wafer sort environment, as it is unlikely that additional device package pins would be available for use at package test.

While an embodiment of the present invention is shown and described, it is envisioned that those skilled in the art may devise various modifications of the present invention without departing from the spirit and scope of the appended claims.

What is claimed is:

1. An active circuit comprising a programmable impedance driver and configured for connection to automatic test equipment for testing the programmable impedance driver, said active circuit comprising a point configured for connecting to the automatic test equipment, a point configured for connecting to ground, said programmable impedance driver of said active circuit disposed between said point configured for connecting to the automatic test equipment and said point configured for connecting to ground, further comprising a test pad disposed between said programmable impedance driver of said active circuit and said point configured for connecting to the automatic test equipment, and said circuit further comprising a test pad disposed between said programmable impedance driver and said point configured for connecting to ground, said active circuit configured such that the programmable impedance driver is testable while the active circuit is active.

2. A circuit as recited in claim 1, wherein said circuit is configured for testing an -channel device.

3. A circuit as recited in claim 1, wherein said circuit further comprises an -channel device disposed between the test pads.

4. A circuit as recited in claim 1, further comprising means for determining the voltages at the test pads and mathematically calculating the resistance of the programmable impedance driver.

5. A circuit as recited in claim 4, wherein the means comprises automatic test equipment, and the circuit is configured such that the programmable impedance driver which is testable using the test pads is active during normal operation of the active circuit.

6. A method for using automatic test equipment to test a programmable impedance driver of an active circuit while the active circuit is active, said method comprising: providing an active circuit comprising a programmable impedance driver, said active circuit comprising a point configured for connecting to the automatic test equipment, a point configured for connecting to ground, said programmable impedance driver of said active circuit disposed between said point configured for connecting to the automatic test equipment and said point configured for connecting to ground, further comprising a test pad disposed between said programmable impedance driver of said active circuit and said point configured for connecting to the automatic test equipment, and said circuit further comprising a test pad disposed between said programmable impedance driver and said point configured for connecting to ground, said method further comprising determining the voltages at the test pads while the active circuit is active and mathematically calculating the resistance of the device.

7. A method as recited in claim 6, further comprising testing the calculated device resistance against previously defined test limits by the manufacturing test program being run on the ATE, and after testing the programmable impedance driver using the test pads, activating the programmable impedance driver during normal operation of the active circuit.

* * * * *